(12) United States Patent  
Anderson et al.

(10) Patent No.: US 7,387,937 B2  
(45) Date of Patent: Jun. 17, 2008

(54) THERMAL DISSIPATION STRUCTURES FOR FINFETS

(75) Inventors: Brent A. Anderson, Jericho, VT (US); Edward J. Nowak, Essex Junction, VT (US); Jed H. Rankin, South Burlington, VT (US); William F. Clark, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/756,078

(22) Filed: May 31, 2007

(65) Prior Publication Data

US 2007/0224743 A1    Sep. 27, 2007

Related U.S. Application Data

(62) Division of application No. 11/160,360, filed on Jun. 21, 2005, now Pat. No. 7,268,397.

(51) Int. Cl.  
*H01L 21/336* (2006.01)

(52) U.S. Cl. ............... 438/281; 438/173; 438/E21.252

(58) Field of Classification Search ............... 438/281, 438/173–175; 257/347–348, 308, 619, E21.57, 257/E21.252  
See application file for complete search history.

(56) References Cited

U.S. PATENT DOCUMENTS

| 6,642,090 | B1 | 11/2003 | Fried et al. |
| 6,664,582 | B2 | 12/2003 | Fried et al. |
| 6,885,055 | B2* | 4/2005 | Lee .......................... 257/308 |
| 2003/0102497 | A1 | 6/2003 | Fried et al. |
| 2003/0178670 | A1 | 9/2003 | Fried et al. |
| 2003/0193058 | A1 | 10/2003 | Fried et al. |
| 2003/0197194 | A1 | 10/2003 | Fried et al. |
| 2004/0150029 | A1 | 8/2004 | Lee |
| 2005/0242395 | A1 | 11/2005 | Chen et al. |

* cited by examiner

*Primary Examiner*—Dung A. Le  
(74) *Attorney, Agent, or Firm*—Gibb & Rahman, LLC; William D. Sabo, Esq.

(57) ABSTRACT

A fin-type field effect transistor has an insulator layer above a substrate and a fin extending above the insulator layer. The fin has a channel region, and source and drain regions. A gate conductor is positioned over the channel region. The insulator layer includes a heat dissipating structural feature adjacent the fin, and a portion of the gate conductor contacts the heat dissipating structural feature. The heat dissipating structural feature can comprise a recess within the insulator layer or a thermal conductor extending through the insulator layer.

20 Claims, 8 Drawing Sheets

THERMAL DISSIPATION STRUCTURES FOR FINFETS

CROSS-REFERENCE TO RELATED APPLICATION

This application is a Divisional of U.S. patent application Ser. No. 11/160,360, filed Jun. 21, 2005, now U.S. Pat. No. 7,268,397, the complete contents of which is incorporated herein by reference.

BACKGROUND OF THE INVENTION

1. Field of the Invention

The invention generally relates to fin-type field effect transistors (FinFETs) and more particularly to FinFETs that include a heat dissipating structural feature (such as a recess in the insulator layer or a thermal conductor extending through the insulator layer) adjacent the fin.

2. Description of the Related Art

As silicon devices are made smaller and smaller, higher circuit density, increased device current, and increased operational frequency lead to increased heat generation inside the chips. Significant technological improvements have been made in terms of chip packaging technologies that allow for chip cooling, but there are several device level technologies which exacerbate the thermal problems. For example in silicon-on-insulator (SOI) technology, since the device layer is thermally isolated from the substrate and the top part of the chip is also covered with insulator, there is significantly higher thermal resistance. One recent advance in transistor technology is the introduction of fin type field effect transistors that are known as FinFETs, which are disclosed in U.S. Pat. No. 6,413,802 to Hu et al. (hereinafter "Hu"), which is incorporated herein by reference. Hu discloses a FinFET structure that includes a center fin that has a channel along its center and source and drains at the ends of the fin structure. In fin-type field effect transistor (FinFET) technology, the current density is higher and the high current region is both further away from the substrate, and is surrounded on all sides by the gate. Therefore, FinFETs present very unique and sophisticated cooling problems that do not affect other types of transistors. The current invention involves a method and structure for improving the thermal conductivity of FinFETs on SOI.

SUMMARY OF THE INVENTION

One embodiment herein presents a method of manufacturing a fin-type field effect transistor (FinFET) that forms an insulator layer above a substrate and then patterns a fin above the insulator layer. The fin has (or can be doped to have) a channel region. The invention also creates a heat dissipating structural feature (such as by forming a recess in the insulator or forming a thermal conductor through the insulator) adjacent the fin. The invention then patterns the gate conductor over the channel region and the insulator, such that a portion of the gate contacts the heat dissipating structural feature. Following this, source and drain regions are formed within the regions of the fin that are not covered by the gate conductor.

This process of patterning the gate conductor forms a portion of the gate conductor within the recess. The recess allows increased thermal transfer between the substrate and the portion of the gate conductor that is positioned within the recess (when compared to the thermal transfer between the substrate and the other portions of the gate conductor). The process of patterning the recess avoids patterning through the insulator layer, which leaves a portion of the insulating layer in tact below the recess. In addition, a thermal conductor material can be deposited within the recess.

As mentioned above, rather than forming a recess, an embodiment herein can form a thermal conductor through the insulator. This process involves forming an opening in the insulator layer and then epitaxially growing the thermal conductor on the substrate through the opening. This effectively extends the substrate through the opening.

The fin-type field effect transistor produced by this processing has an insulator layer above the substrate and a fin extending above the insulator layer. The fin has a channel region, and source and drain regions. A gate conductor is positioned over the channel region. The insulator layer includes a heat dissipating structural feature adjacent the fin, and a portion of the gate conductor contacts the heat dissipating structural feature.

Again, the heat dissipating structural feature can comprise a recess within the insulator layer or the extension of the substrate, as discussed above. A portion of the gate conductor can be positioned within the recess and this portion of the gate conductor that is positioned within the recess is closer to the substrate than other portions of the gate conductor. The recess allows increased thermal transfer between the substrate and the portion of the gate conductor that is positioned within the recess (when compared to thermal transfer between the substrate and the other portions of the gate conductor). The recess does not extend (avoids extending) completely through the insulator layer. This embodiment can include a thermal conductor positioned within the recess.

The heat dissipating structural feature can also comprise a thermal conductor or the substrate extending completely through the insulator. In this case, the insulator layer includes an opening adjacent the fin and the substrate includes a portion that extends through the opening. A portion of the gate conductor contacts this thermal conductor that extends through the opening. This contact between the gate conductor and the thermal conductor that extends through the opening allows increased thermal transfer between the gate conductor and the thermal conductor that extends through the opening within the insulator (when compared to thermal transfer between the gate conductor and other portions of the substrate). The opening runs parallel to the fin. The thermal conductor that extends through the opening within the insulator extends above the insulator. The thermal conductor that extends through the opening can comprise a material having structural features indicating epitaxial growth.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

The embodiments herein allow for improved thermal conductivity of silicon-on-insulator (SOI) fin-type field effect transistors (FinFETs) by reducing the thermal resistance between the gate and the substrate. In complementary metal oxide semiconductor (CMOS) technology, the bulk of the thermal generation occurs within the channel region. In conventional CMOS, there is very little thermal resistance from dissipating this heat downwards to the substrate. In SOI, the entire silicon island heats up, and then also dissipates the heat outward (primarily downward) to the substrate. However, in FinFET technology, the channel is contained inside the vertical fin. There is very little cross-sectional area for downward thermal transport to the substrate. The gate, however, surrounds the fin on three sides, and is separated from the fin only by a gate oxide. This makes the gate the primary recipient of the thermal energy generated in the channel region.

This invention provides a means of reducing the thermal resistance from the gate to the substrate, allowing the gate to become the primary transport mechanism for the thermal energy produced in the fin by modifying the geometry of the gate and the buried oxide (BOX) above the substrate.

Figure 1:
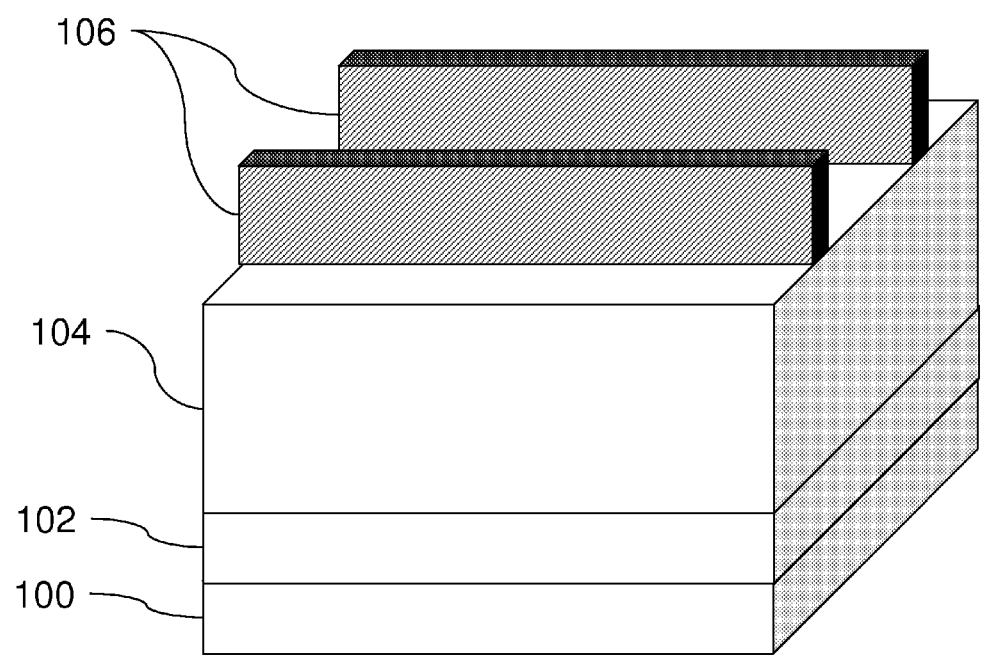
FIG. 1 is a schematic diagram of a partially completed FinFET structure according to the invention.
Figure 2:
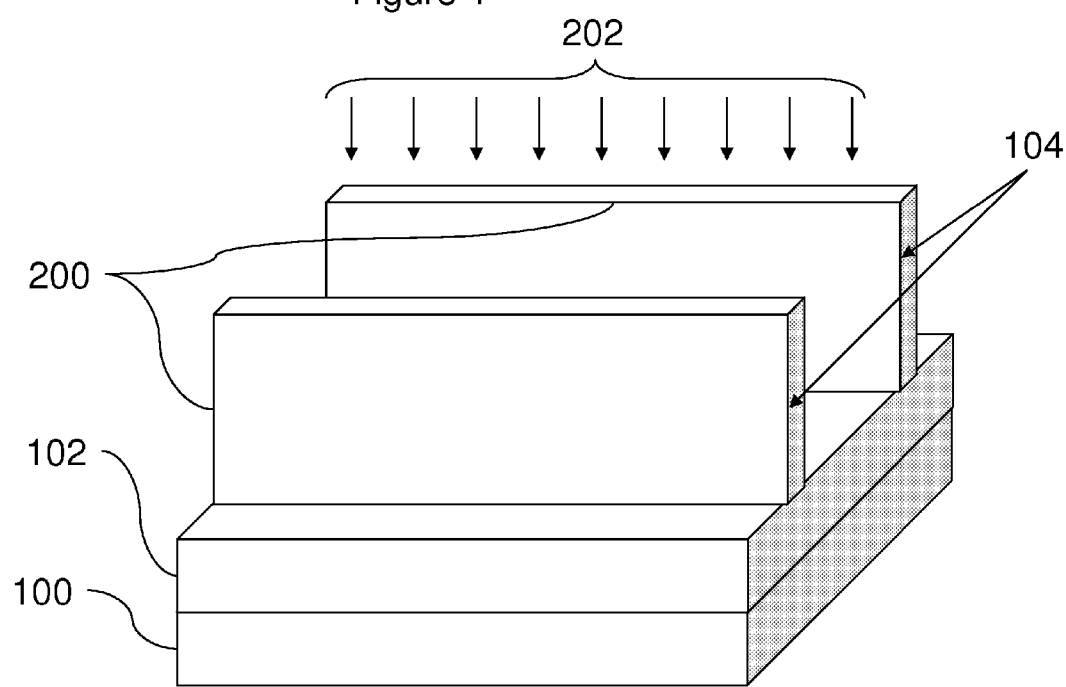
FIG. 2 is a schematic diagram of a partially completed FinFET structure according to the invention.
Figure 3:
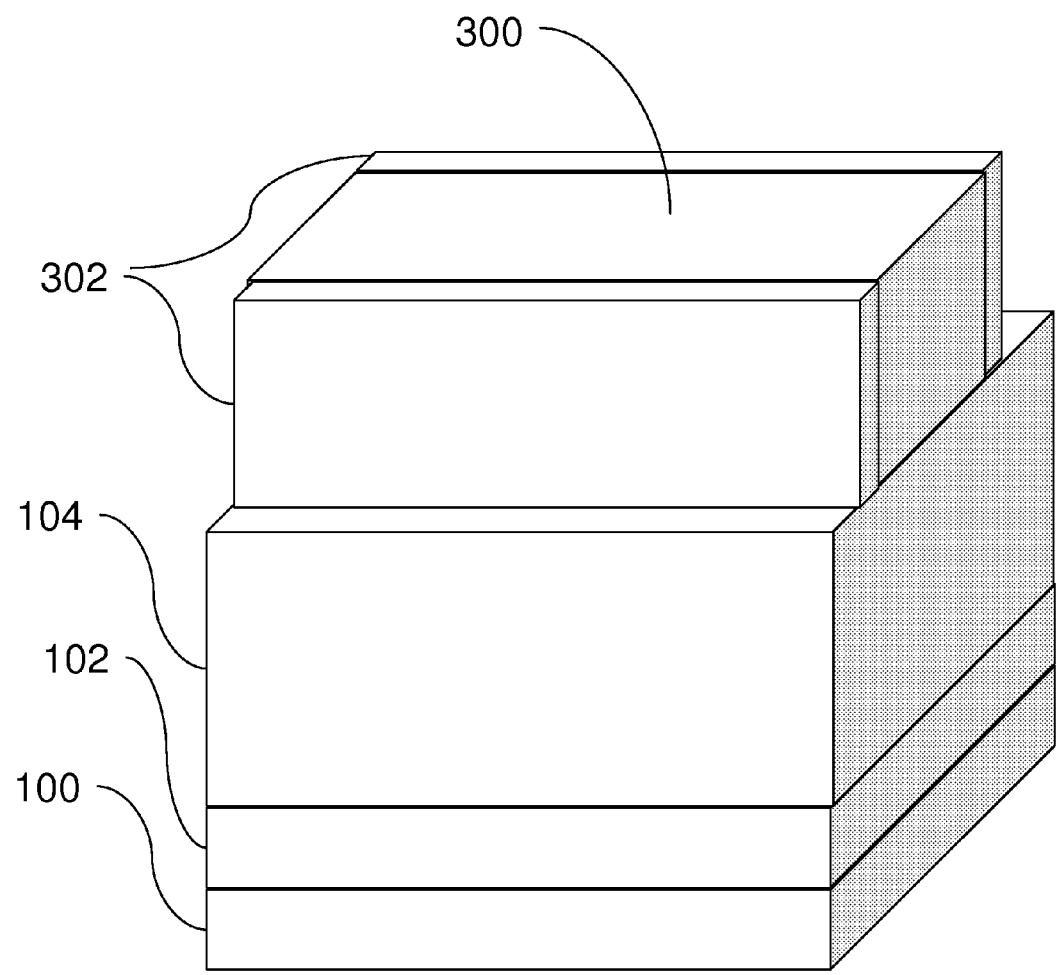
FIG. 3 is a schematic diagram of a partially completed FinFET structure according to the invention.

FIGS. 1-3 illustrate some non-limiting ways in which the fin structure may be formed. As shown in FIG. 1, this embodiment forms an insulator layer 102 (such as an oxide, nitride, etc.) on a silicon layer 100, thereby creating the silicon-on-insulator base 100/102 on which the transistor will be built. The invention forms a fin material layer 104 (such as single crystal silicon, SiGe, etc.) on the insulator. A mask 106 (such as an organic photoresist, etc.) is patterned over the fin material 104 and a common material removal process such as etching, chemical treatment, etc. is used to remove the exposed portion of the material 104 to leave one or more freestanding fins 104, as shown in FIG. 2. Note that the fin 104 is a rectangular structure that extends perpendicularly from the insulator layer 102.

As shown by arrows 202, the fins 104 can be doped to be effective semiconductors. Alternatively, the fin material 104 shown in FIG. 1 can be deposited "pre-doped" or in situ doped. Alternatively, the bulk unpatterned fin material 104 in FIG. 1 can be doped. An insulator 200 such as a grown oxide or a conformally deposited insulator is then formed on the exterior of the fins 104. This oxide 200 will eventually become the gate oxide of the transistor.

Figure 4:
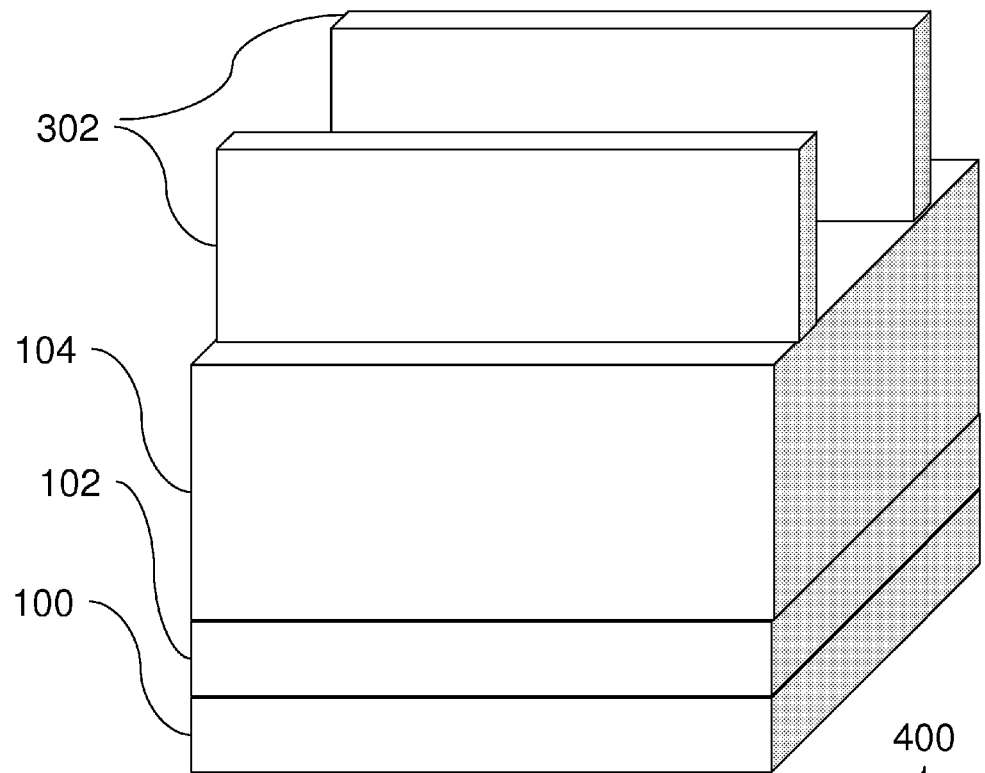
FIG. 4 is a schematic diagram of a partially completed FinFET structure according to the invention.

An alternative method to form the fins 104 is shown in FIGS. 3 and 4. This method is sometimes referred to as sidewall spacer technology or sidewall image transfer (SIT). In this method, a placeholder 300 (mandrel) is patterned on the fin material layer 104 using conventional techniques such as photolithography. Then, a mask material 302 is then deposited over the placeholder 300. Next, a selective directional etching process is utilized to remove the mask material 302 from horizontal surfaces at a higher rate than it removes material from vertical surfaces. This leaves the mask material 302 only on the side walls of the placeholder 300 as sidewall spacers. The upper surface of the structure is than preferably polished (using, for example, chemical mechanical polishing (CMP)) to remove any excess mask material 302, leaving the structure shown in FIG. 3. After this, the placeholder 300 is removed resulting in the mask structure 302 shown in FIG. 4. The underlying fin material layer 104 is then etched as shown in FIG. 2 using the mask structure 302 and the mask 302 is then removed to result in the structure shown in FIG. 2. The doping process and formation of gate insulators shown in FIG. 2 is also performed on this structure. The sidewall image transfer process shown in FIGS. 3 and 4 can be used to make smaller features than the masking process shown in FIG. 1.

Figure 5:
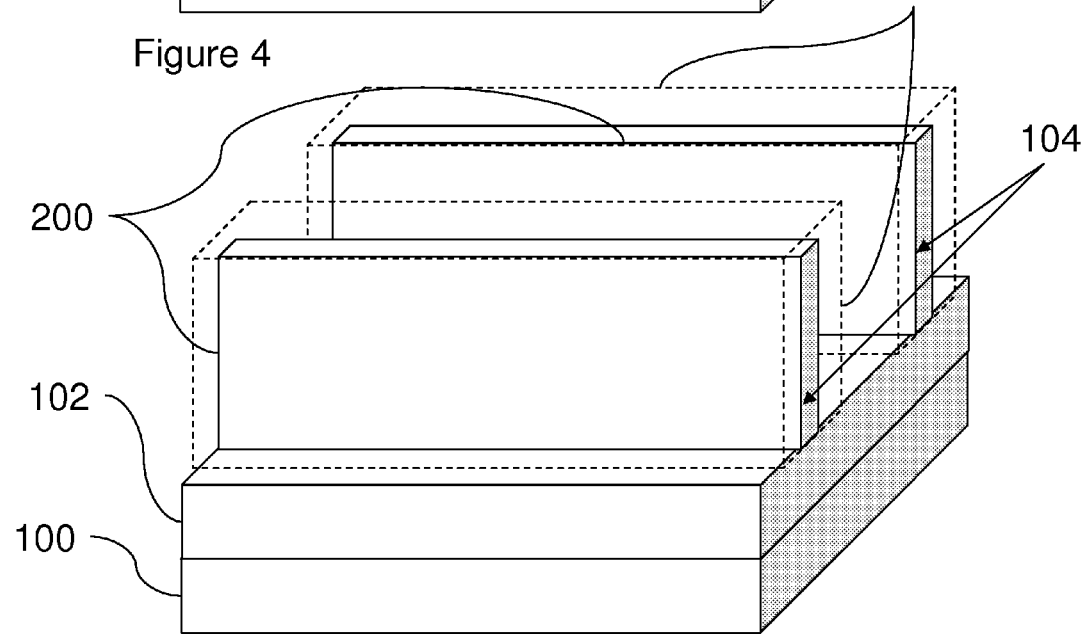
FIG. 5 is a schematic diagram of a partially completed FinFET structure according to the invention.
Figure 6:
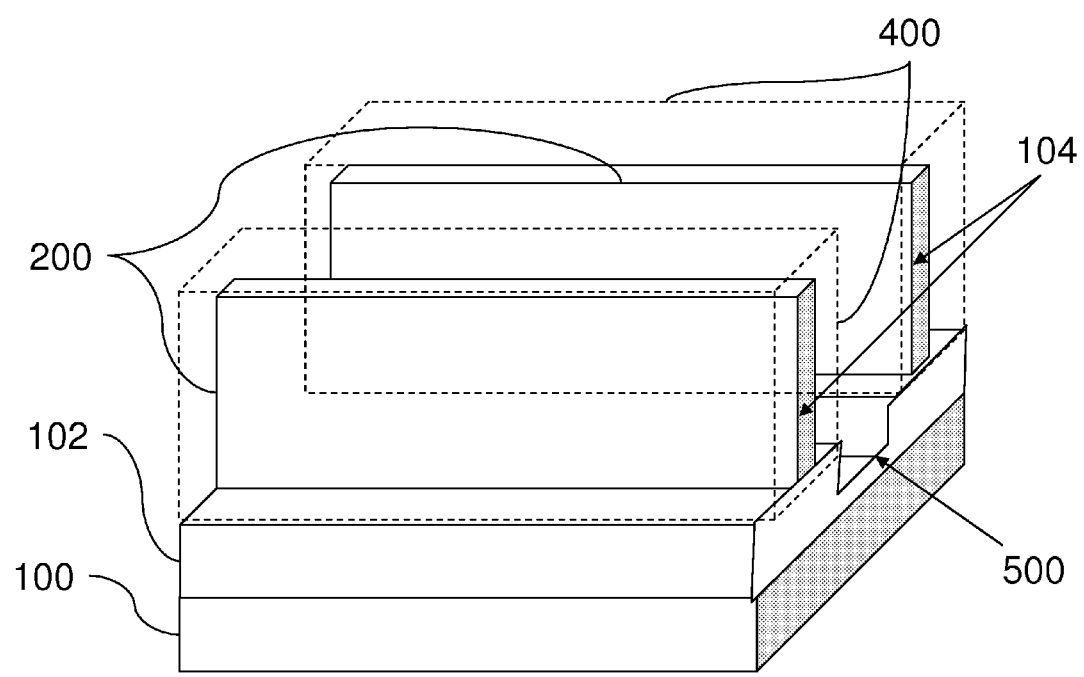
FIG. 6 is a schematic diagram of a partially completed FinFET structure according to the invention.
Figure 7:
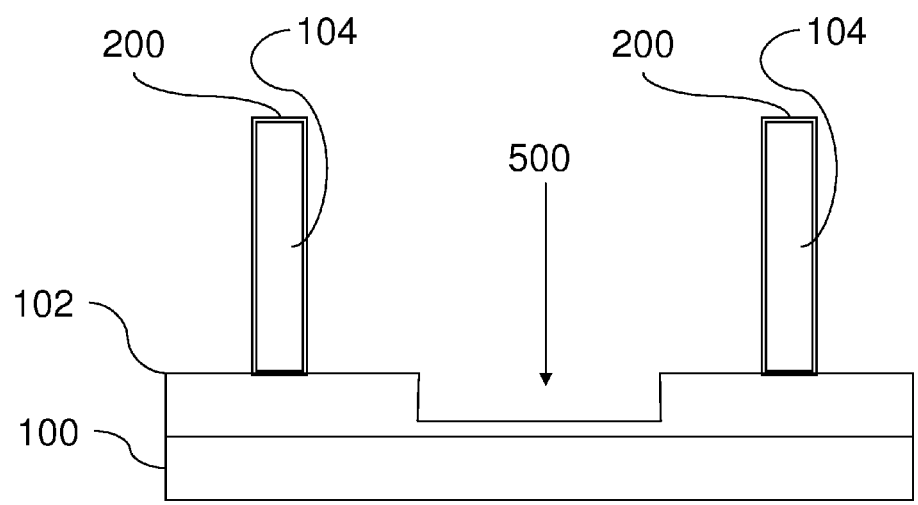
FIG. 7 is a schematic diagram of a partially completed FinFET structure according to the invention.

One embodiment shown in FIGS. 5-11 creates a heat dissipating structural feature by forming a recess 500 in the insulator layer 102 adjacent the fin. FIG. 5 illustrates a mask 400 (such as the organic photoresist mask mentioned above) that is patterned to leave an area of the insulator layer 102 between the fins 104 exposed. Next, as shown in FIG. 6, a material removal process is used to reduce the thickness of the insulating layer 102, without patterning completely through the insulator layer 102, to create the recess 500. FIG. 6 is a perspective view, while FIG. 7 is cross-sectional view of the same structure without the mask 400. This material removal process can comprise any conventional material removal process, such as etching or chemical application, that is selective to the mask material, such that the mask material is substantially unaffected when the insulator layer 102 material is being removed. This process can be controlled to not completely extend through the insulator layer 102, using a timed etch or some form of marker layer.

Figure 8:
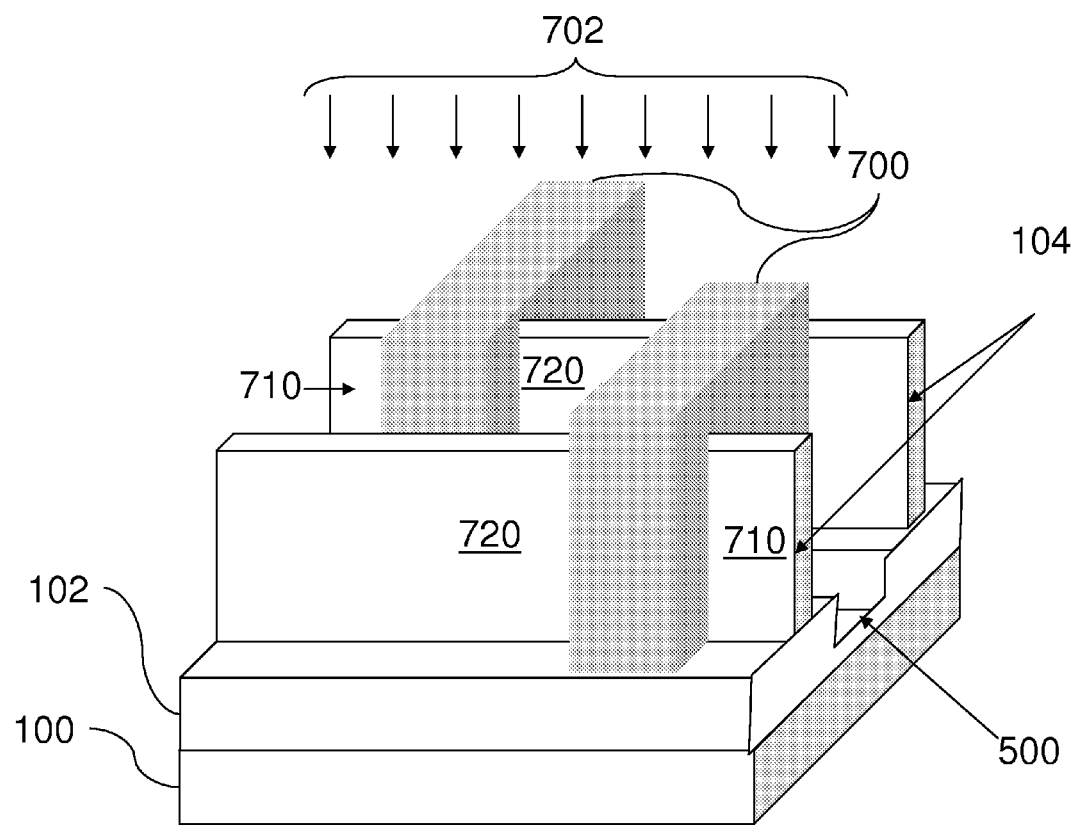
FIG. 8 is a schematic diagram of a partially completed FinFET structure according to the invention.

In FIG. 8, the invention then patterns the gate conductor 700 over the channel region of the fin 104 and the insulator layer 102, such that a portion of the gate contacts the heat dissipating structural feature (e.g., the recess 500). This process of patterning the gate conductors 700 can comprise a process of depositing a blanket layer of the gate conductor material, followed by a masked material removal process, such as that shown in FIGS. 5 and 6. The gate conductor 700 material can comprise any conductor, such as polysilicon, doped insulators that are made conductive, metals, alloys, etc. Following this, the gate insulator 200 is removed and impurities 702 are implanted in the regions of the fin 104 that are not covered by the gate conductor to form source and drain regions 710, 720.

Figure 9:
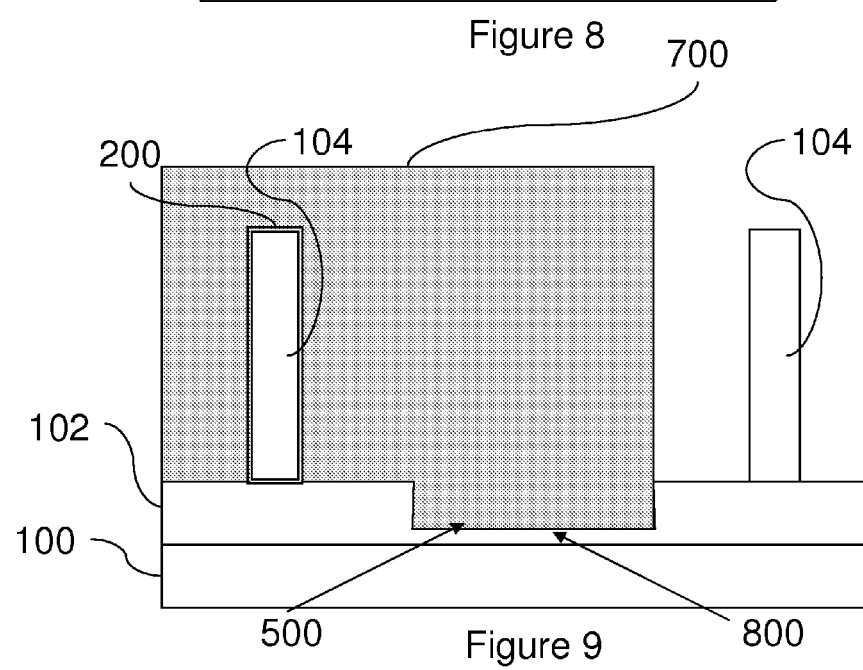
FIG. 9 is a schematic diagram of a partially completed FinFET structure according to the invention.
Figure 10:
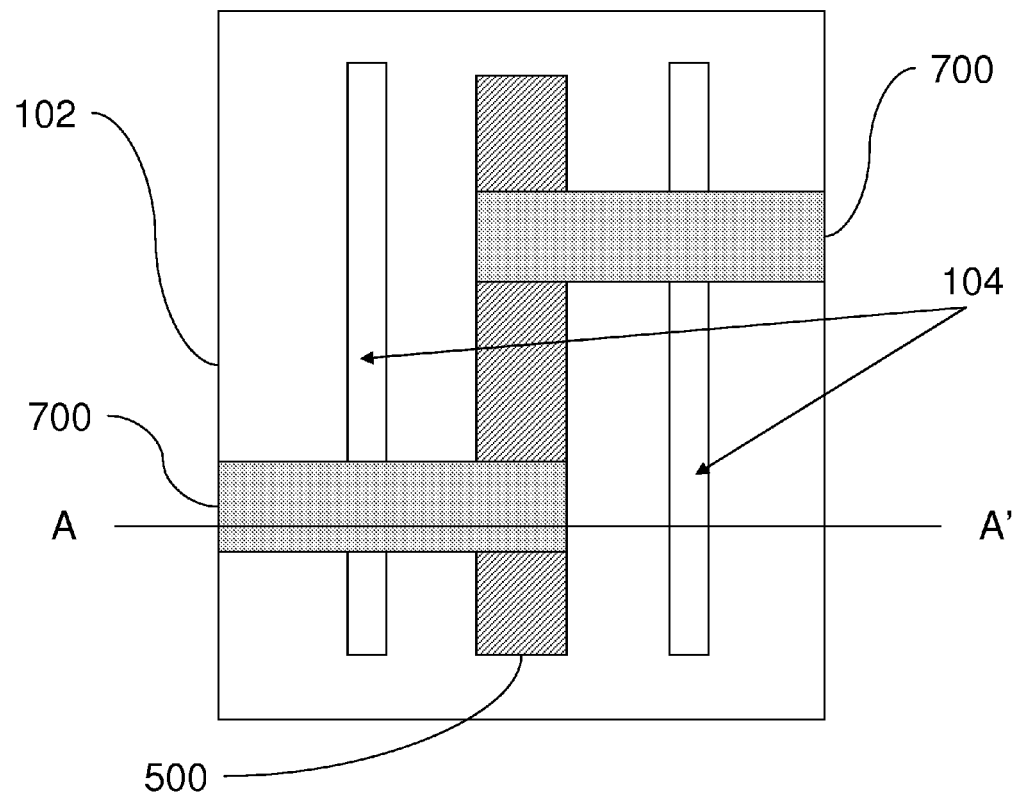
FIG. 10 is a schematic diagram of a partially completed FinFET structure according to the invention.
Figure 11:
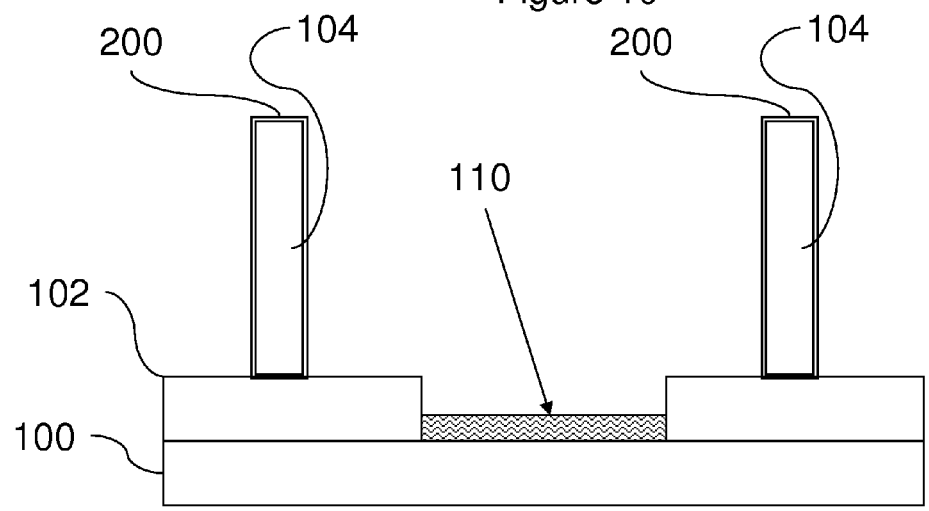
FIG. 11 is a schematic diagram of a partially completed FinFET structure according to the invention.

FIG. 9 shows the same structure shown in FIG. 8 in cross-section and FIG. 10 illustrates a top view of the same structure. The cross-section in FIG. 9 is drawn along line A-A' in FIG. 10. This process of patterning the gate conductor 700 forms a portion of the gate conductor 700 within the recess 500. The recess 500 allows increased thermal transfer (in the region represented by arrow 800) between the substrate 100 and the portion of the gate conductor 700 that is positioned within the recess 500 (when compared to the thermal transfer between the substrate and the other portions of the gate conductor 700). The process of patterning the recess 500 avoids patterning through the insulator layer 102, which leaves a portion of the insulating layer in tact below the recess 500. In addition, a thermal conductor 110 material (such as a metal, alloy, etc.) can be deposited within the recess 500, prior to forming the gate conductors 700, as shown in FIG. 11, to increase thermal conduction between the gate conductor 700 and the substrate 100.

As shown in FIGS. 8-11, the fin-type field effect transistor produced by this processing has an insulator layer 102 above the substrate and a fin 104 extending above the insulator layer 102. The fin 104 has a channel region, and source and drain regions 710, 720. A gate conductor 700 is positioned over the channel region and is separated from the channel region by the gate oxide 200. The insulator layer 102 includes a heat dissipating structural feature 500 adjacent the fin 104, and a portion of the gate conductor 700 contacts the heat dissipating structural feature 500.

Again, the heat dissipating structural feature can comprise a recess 500 within the insulator layer 102. A portion of the gate conductor 700 is positioned within the recess 500 and this portion of the gate conductor 700 that is positioned within the recess 500 is closer to the substrate 100 than other portions of the gate conductor 700. The recess 500 allows increased thermal transfer 800 between the substrate 100 and the portion of the gate conductor 700 that is positioned within the recess 500 (when compared to thermal transfer between the substrate 100 and the other portions of the gate conductor 700). The recess 500 does not extend (avoids extending) all the way through the insulator layer 102. This embodiment can include a thermal conductor 110 positioned within the recess 500.

Figure 12:
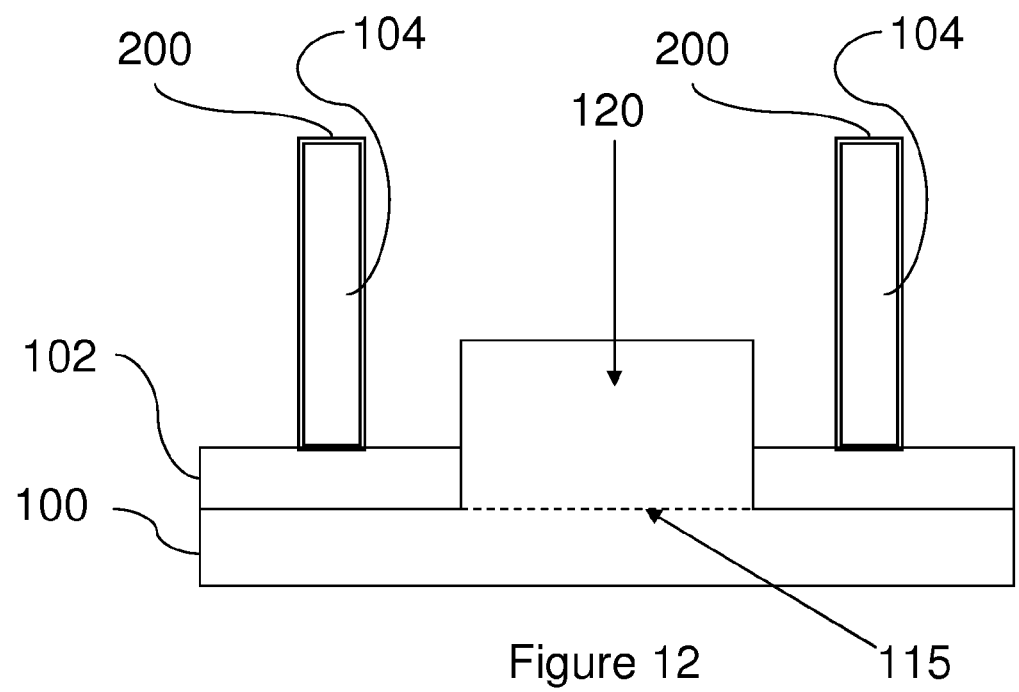
FIG. 12 is a schematic diagram of a partially completed FinFET structure according to the invention.

As mentioned above, rather than forming a recess 500, an embodiment herein can form a thermal conductor 120 through the insulator. This process involves forming an opening 115 in the insulator layer 102 by extending the material removal process shown in FIG. 6 so that a complete opening 115 is formed through the insulator layer 102 as shown in FIG. 12. This opening 115 exposes the substrate 100. This is followed by a process of epitaxially growing or depositing a thermal conductor (such as an epitaxially grown substrate material, or a deposited metal, alloy, etc.) 120 on the substrate 100 through the opening 115, as shown in FIG. 12. This can effectively extend the substrate 100 through the opening 115 as item 120. Alternatively, the thermal conductor 120 can be deposited in the opening 115 and can comprise any material that is highly thermally conductive that does not otherwise interfere with the operation of the remainder of the circuit.

Figure 13:
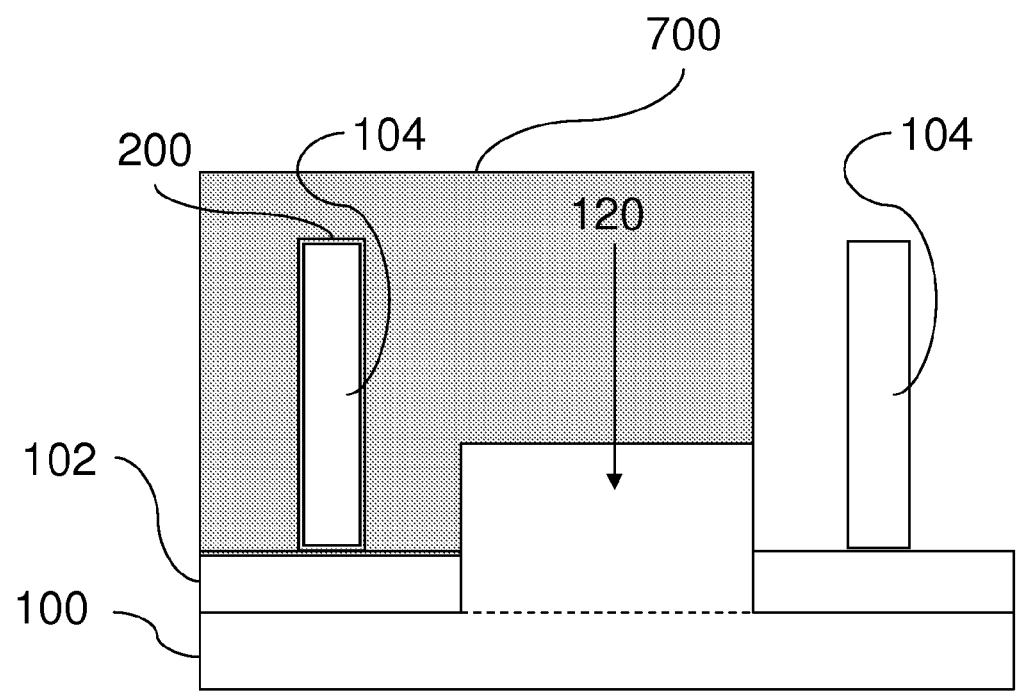
FIG. 13 is a schematic diagram of a partially completed FinFET structure according to the invention.

A portion of the gate conductor 700 contacts the thermal conductor 120 that extends through the opening 115 as shown in FIG. 13. The opening 115 can run parallel to the fin 104. The thermal conductor 120 that extends through the opening 115 within the insulator layer 102 can extend above the top of the insulator layer 102. The thermal conductor 120 that extends through the opening 115 can comprise a material having structural features indicating epitaxial growth if the thermal conductor 120 comprises editorially grown substrate material. Thus, upon microscopic inspection, the material 120 can have a structure that is consistent with those structures formed by epitaxial processing. Also, the portion of the gate conductor 700 that contacts the thermal conductor 120 allows increased thermal transfer between the gate conductor 700 and the thermal conductor 100 (when compared to thermal transfer between the gate conductor 700 and other portions of the substrate 100).

Figure 14:
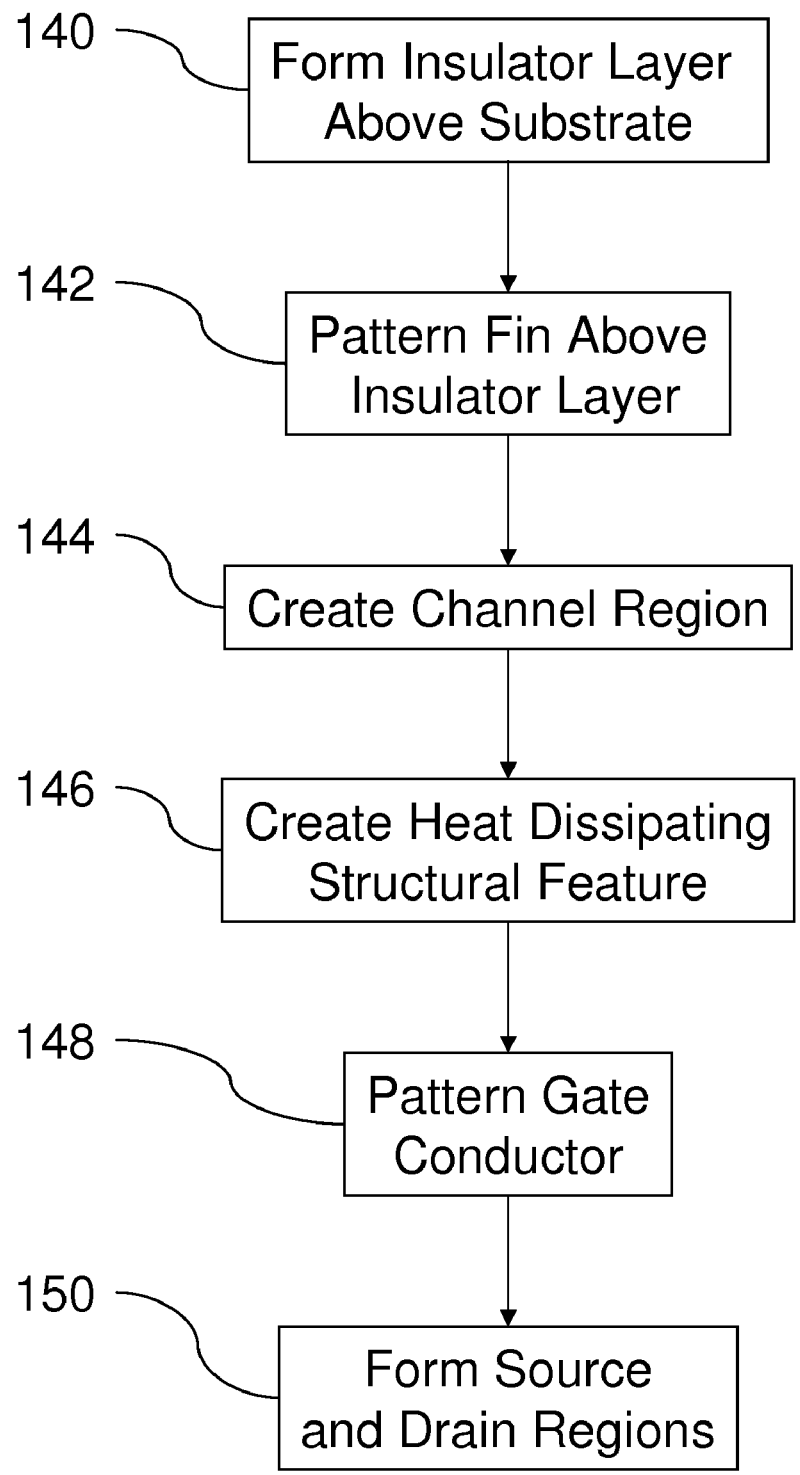
FIG. 14 is a flowchart showing the methodology of the present invention.

FIG. 14 shows the inventive processing in flowchart form. More specifically, in item 140, the invention forms an insulator layer above a substrate and then patterns a fin above the insulator layer (142). The fin has (or can be doped to have) a channel region in item 144. The invention also creates a heat dissipating structural feature (such as by forming a recess in the insulator or forming a thermal conductor through the insulator) adjacent the fin in item 146. The invention then patterns the gate conductor over the channel region and the insulator in item 148, such that a portion of the gate contacts the heat dissipating structural feature. Following this, source and drain regions are formed within the regions of the fin that are not covered by the gate conductor in item 150.

This process of patterning the gate conductor 148 forms a portion of the gate conductor within the recess. The recess allows increased thermal transfer between the substrate and the portion of the gate conductor that is positioned within the recess (when compared to the thermal transfer between the substrate and the other portions of the gate conductor). The process of patterning the recess 146 can avoid patterning completely through the insulator layer, which leaves a portion of the insulating layer in tact below the recess. In addition, a thermal conductor material can optionally be deposited within the recess.

As mentioned above, rather than forming a recess, the process of creating the heat dissipating structural feature 146 can form a thermal conductor through the insulator. This process involves forming an opening in the insulator layer and then epitaxially growing the thermal conductor on the substrate car depositing a thermal conductor through the opening. This effectively extends the substrate through the opening.

Thus, the embodiments presented herein allow for improved thermal conductivity of silicon-on-insulator (SOI) fin-type field effect transistors (FinFETs) by reducing the thermal resistance between the gate and the substrate. The invention allows the gate to become the primary transport mechanism for the thermal energy produced in the fin by modifying the geometry of the gate and the buried oxide (BOX) above the substrate.

The foregoing description of the specific embodiments will so fully reveal the general nature of the invention that others can, by applying current knowledge, readily modify and/or adapt for various applications such specific embodiments without departing from the generic concept. Therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method of manufacturing a fin-type field effect transistor (FinFET), said method comprising:

forming an insulator layer above a substrate;
patterning a fin above said insulator layer, said fin having a channel region;
creating a heat dissipating structural feature adjacent said fin; and
patterning a gate conductor over said channel region and said insulator layer, such that a portion of said gate contacts said heat dissipating structural feature.

2. The method in claim 1, all the limitations of which are incorporated herein by reference, wherein said process of creating said heat dissipating structural feature comprises patterning a recess within said insulator layer.

3. The method in claim 2, all the limitations of which are incorporated herein by reference, wherein said process of patterning said gate conductor forms a portion of said gate conductor within said recess.

4. The method in claim 3, all the limitations of which are incorporated herein by reference, wherein said process of patterning said gate conductor forms said portion of said gate conductor that is positioned within said recess closer to said substrate than other portions of said gate conductor.

5. The method in claim 3, all the limitations of which are incorporated herein by reference, wherein said process of patterning said recess allows increased thermal transfer between said substrate and said portion of said gate conductor that is positioned within said recess, when compared to thermal transfer between said substrate and said other portions of said gate conductor.

6. The method in claim 2, all the limitations of which are incorporated herein by reference, wherein said process of patterning said recess avoids patterning through said insulator layer.

7. The method in claim 2, all the limitations of which are incorporated herein by reference, further comprising forming a thermal conductor within said recess.

8. The method in claim 1, all the limitations of which are incorporated herein by reference, wherein said process of forming said heat dissipating structural feature comprises forming a thermal conductor through said insulator layer.

9. A method of manufacturing a fin-type field effect transistor (FinFET), said method comprising:
forming an insulator layer above a substrate;
patterning a fin above said insulator layer, said fin having a channel region;
patterning a recess within said insulator layer; and
patterning a gate conductor over said channel region and said insulator layer, such that a portion of said gate conductor is formed within said recess.

10. The method in claim 9, all the limitations of which are incorporated herein by reference, wherein said process of patterning said recess forms said recess adjacent to said fin.

11. The method in claim 9, all the limitations of which are incorporated herein by reference, wherein said process of patterning said recess forms said recess parallel to said fin.

12. The method in claim 9, all the limitations of which are incorporated herein by reference, wherein said process of patterning said gate conductor forms said portion of said gate conductor that is positioned within said recess closer to said substrate than other portions of said gate conductor.

13. The method in claim 9, all the limitations of which are incorporated herein by reference, wherein said process of patterning said recess allows increased thermal transfer between said substrate and said portion of said gate conductor that is positioned within said recess, when compared to thermal transfer between said substrate and other portions of said gate conductor.

14. The method in claim 9, all the limitations of which are incorporated herein by reference, wherein said process of patterning said recess avoids patterning through said insulator layer.

15. The method in claim 9, all the limitations of which are incorporated herein by reference, further comprising forming a thermal conductor within said recess.

16. A method of manufacturing a fin-type field effect transistor (FinFET), said method comprising:
forming an insulator layer above a substrate;
patterning a fin above said insulator layer, said fin having a channel region;
forming a thermal conductor through said insulator layer; and
patterning a gate conductor over said channel region and said insulator layer, such that a portion of said gate contacts said thermal conductor.

17. The method in claim 16, all the limitations of which are incorporated herein by reference, wherein said process of forming said thermal conductor comprises:
forming an opening in said insulator layer adjacent said fin; and
epitaxially growing said thermal conductor on said substrate through said opening.

18. The method in claim 16, all the limitations of which are incorporated herein by reference, wherein said process of epitaxially growing said thermal conductor extends said substrate through said opening.

19. The method in claim 16, all the limitations of which are incorporated herein by reference, wherein said process of patterning said gate conductor forms a portion of said gate conductor in contact with said thermal conductor.

20. The method in claim 19, all the limitations of which are incorporated herein by reference, wherein said process of forming said thermal conductor allows increased thermal transfer between said substrate and said portion of said gate conductor that is in contact with said thermal conductor, when compared to thermal transfer between said substrate and other portions of said gate conductor.

* * * * *